United States Patent
Adachi

(10) Patent No.: US 11,621,180 B2
(45) Date of Patent: Apr. 4, 2023

(54) HEATING DEVICE

(71) Applicant: NISSIN ION EQUIPMENT CO., LTD., Koka (JP)

(72) Inventor: Masakazu Adachi, Koka (JP)

(73) Assignee: NISSIN ION EQUIPMENT CO., LTD., Koka (JP)

( * ) Notice: Subject to any disclaimer, the term of this patent is extended or adjusted under 35 U.S.C. 154(b) by 395 days.

(21) Appl. No.: 16/931,563

(22) Filed: Jul. 17, 2020

(65) Prior Publication Data

US 2020/0350189 A1 Nov. 5, 2020

Related U.S. Application Data

(63) Continuation-in-part of application No. 15/678,296, filed on Aug. 16, 2017, now Pat. No. 10,916,457.

(30) Foreign Application Priority Data

Oct. 31, 2016 (JP) .................................. 2016-212481
Mar. 24, 2017 (JP) .................................. 2017-060206

(51) Int. Cl.
*H01L 21/67* (2006.01)
*H01L 21/683* (2006.01)
*H01L 21/687* (2006.01)

(52) U.S. Cl.
CPC .. *H01L 21/67115* (2013.01); *H01L 21/67248* (2013.01); *H01L 21/6831* (2013.01); *H01L 21/68721* (2013.01)

(58) Field of Classification Search
CPC ......... H01L 21/67103; H01L 21/67115; H01L 21/67248; H01L 21/67751; H01L 21/6831; H01L 21/68707; H01L 21/68721; H01L 21/68764

USPC ............................................. 219/443.1–468.2
See application file for complete search history.

(56) References Cited

U.S. PATENT DOCUMENTS

| | | | |
|---|---|---|---|
| 5,452,396 A * | 9/1995 | Sopori | H05B 3/0047 118/724 |
| 6,021,152 A | 2/2000 | Olsen et al. | |
| 6,549,392 B1 | 4/2003 | Ohno et al. | |
| 7,589,950 B2 | 9/2009 | Parkhe et al. | |
| 10,916,457 B2 * | 2/2021 | Adachi | H01L 21/68707 |
| 2002/0086260 A1 | 7/2002 | Shang et al. | |

(Continued)

FOREIGN PATENT DOCUMENTS

JP 6-204316 A 7/1994
JP 10-284569 A 10/1998

(Continued)

OTHER PUBLICATIONS

Communication dated Oct. 18, 2017 from the Japanese Patent Office in counterpart application No. 2017-060206.

*Primary Examiner* — Sang Y Paik
(74) *Attorney, Agent, or Firm* — Sughrue Mion, PLLC

(57) ABSTRACT

A heating device is provided. The heating device includes a conveyance member, first and second support members, and a heat reflecting plate. The first support member is provided on the conveyance member and supports a substrate during movement of the conveyance member. The second support member includes a heater and supports the substrate during processing of the substrate. The heat reflecting plate travels with the conveyance member and reflects heat from the heater toward the substrate.

20 Claims, 16 Drawing Sheets

(56) References Cited

U.S. PATENT DOCUMENTS

| | | | |
|---|---|---|---|
| 2005/0023267 A1* | 2/2005 | Timans | H01L 21/67115 |
| | | | 219/390 |
| 2012/0308215 A1 | 12/2012 | Li | |
| 2013/0118407 A1 | 5/2013 | Park et al. | |
| 2017/0215230 A1* | 7/2017 | Parkhe | H01L 21/67248 |

FOREIGN PATENT DOCUMENTS

| | | |
|---|---|---|
| JP | 2013-535833 A | 9/2013 |
| JP | 2015-015330 A | 1/2015 |
| JP | 2015-154045 A | 8/2015 |
| JP | 2015-211201 A | 11/2015 |

* cited by examiner

HEATING DEVICE

CROSS-REFERENCE TO RELATED APPLICATIONS

This application is a continuation-in-part of U.S. application Ser. No. 15/678,296, filed Aug. 16, 2017, which claims priority from Japanese Patent Application No. 2017-060206, filed Mar. 24, 2017, and from Japanese Patent Application No. 2016-212481, filed Oct. 31, 2016 in the Japanese Patent Office, the entire contents of each of which are hereby incorporated by reference in their entirety.

BACKGROUND

1. Field

Apparatuses and devices consistent with the present disclosure relate to a heating device for raising a temperature of a substrate.

2. Description of the Related Art

In semiconductor manufacturing, a substrate may be heated to a given temperature in order to perform a film forming treatment on the substrate, after which ion implantation is performed on the heated substrate.

SUMMARY

It is an aspect to provide a heating device capable of improving substrate heating efficiency to shorten a heating-up period, and of operating according to reduced input power so as to achieve lower power consumption, and to provide a semiconductor manufacturing apparatus equipped with the heating device.

According to an aspect of one or more exemplary embodiments, there is provided a heating device comprising a conveyance member; a first support member that is provided on the conveyance member and that supports a substrate during movement of the conveyance member; a second support member that includes a heater and that supports the substrate during processing of the substrate; and a heat reflecting plate that travels with the conveyance member and that reflects heat from the heater toward the substrate.

According to another aspect of one or more exemplary embodiments, there is provided a heating device comprising an arm having a substrate support that supports a substrate attached thereto; a heater operable to heat a surface of the substrate; and a heat reflecting plate formed of a portion of the arm that is opposite to the substrate.

BRIEF DESCRIPTION OF THE DRAWINGS

FIGS. 5A and 5B are explanatory diagrams depicting a modification of a heat reflecting plate, wherein FIG. 5A is a top plan view along an X-Y plane, and FIG. 5B is a sectional view in the Z direction and taken along a line V-V in FIG. 5A;

FIGS. 9A and 9B are explanatory diagrams depicting another modification of a heat reflecting plate, wherein FIG. 9A is a top plan view along an X-Y plane, and FIG. 9B is a sectional view in the Z direction taken along the line V-V in FIG. 9A;

DESCRIPTION OF EXEMPLARY EMBODIMENTS

Figure 1:
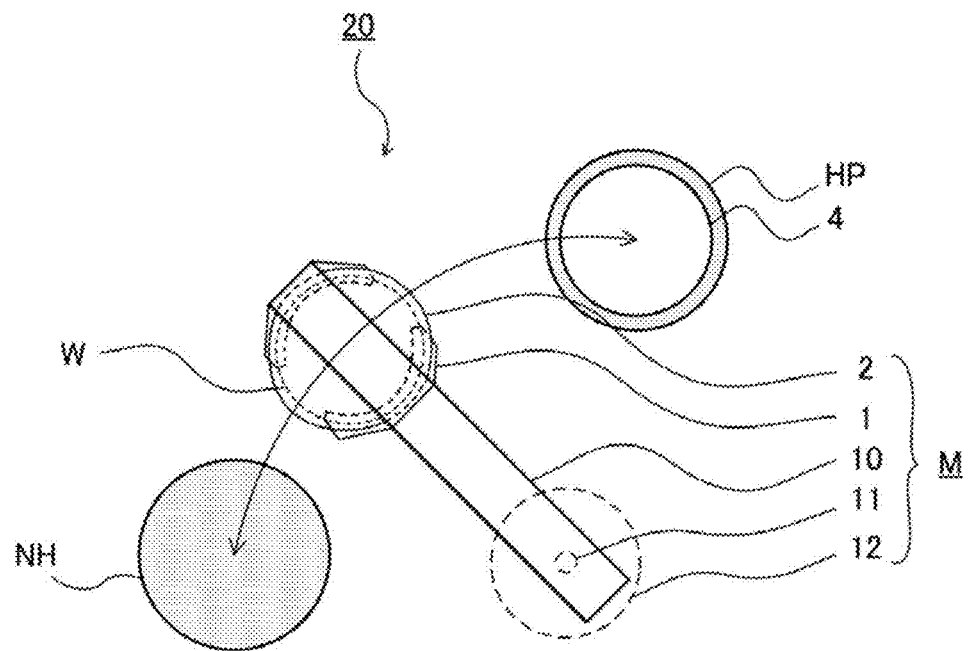
FIG. 1 is a schematic diagram depicting a configuration of a heating device according to an exemplary embodiment.

As a means to heat a substrate, there is a technique of supporting a substrate on one end of a conveyance arm, turning the conveyance arm so as to convey the substrate from a non-heating position to a heating position, and heating the substrate from a side of one surface of the substrate by a heater disposed at the heating position.

In this substrate heating technique, heat is liable to be dissipated from the other surface (non-heated surface) of the substrate on a side where the heater is not disposed, thereby causing poor substrate heating efficiency. This dissipation also leads to problems such as an increase in the time necessary for enabling the substrate to reach a given temperature, and an increase in power consumption of the heater.

Additionally, in general, an ion implantation process causes crystal defects in a substrate.

An annealing process is performed after the ion implantation process in order to cure these crystal defect However, in some substrates, for example in a silicon carbide (SiC), it is difficult to cure crystal defects by a related art annealing process performed after the ion implantation process, and therefore the substrate is heated during the ion implantation process. That is, ion implantation is performed on the substrate while the substrate is heated to a high temperature.

Specifically, the substrate is supported on an electrostatic chuck with a heater. That is, the substrate may be clamped by an electrostatic chuck or a mechanical clamp, the temperature of the substrate is raised to a predetermined temperature (e.g., about 400 to about 600° C.), and then ion implantation processing is performed on the substrate supported by the electrostatic chuck.

In this case, a substrate at a low temperature is supported by a high temperature electrostatic chuck. If the temperature difference between the substrate and the electrostatic chuck/mechanical clamp is large, the large temperature difference causes thermal stress to the substrate.

When power is turned off to the electrostatic chuck after the ion implantation process or when the mechanical clamp is released, the thermal stress of the substrate is released and the substrate may jump.

In order to prevent the above substrate jumping, the temperature difference between the temperature of the substrate and the temperature of the electrostatic chuck/mechanical clamp may be reduced (for example, to 50° C. or less) before the substrate is released, so that no thermal stress is generated on the substrate.

Specifically, after the substrate is transferred onto the electrostatic chuck/mechanical clamp, the temperature of the substrate is raised by the heater until the temperature of the substrate becomes equivalent to the temperature of the electrostatic chuck/mechanical clamp. However, this process has a disadvantage in that it takes a significant amount of time to raise lower the temperature of the substrate, and specifically to reduce the temperature difference between the substrate and the electrostatic chuck/mechanical clamp.

Figure 2A:
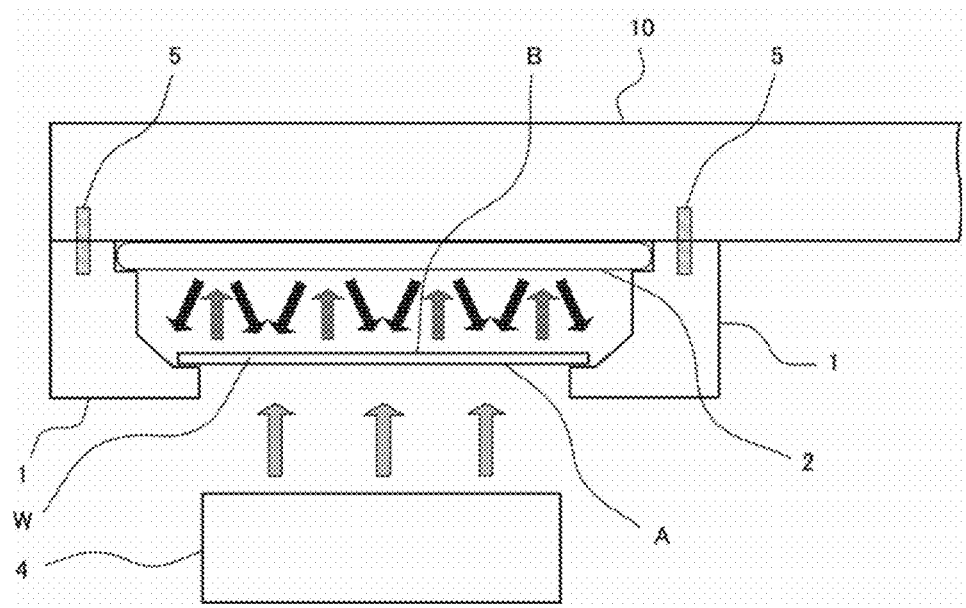
FIG. 2A is a schematic side view depicting the heating device in FIG. 1, in a state in which a substrate is conveyed to a heating position.
Figure 2B:
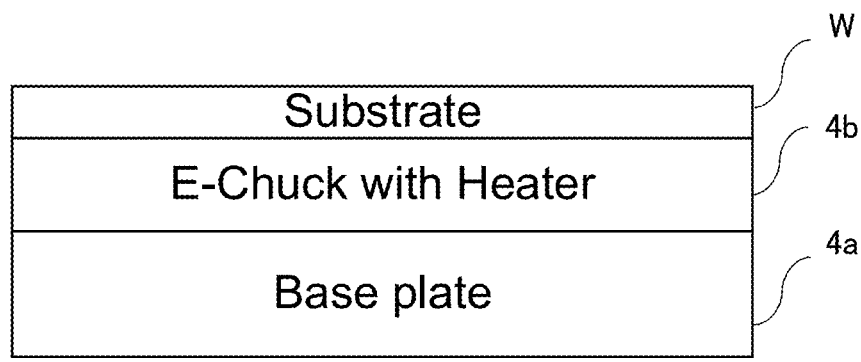
FIGS. 2B-2D illustrate a second support member of the heating device of FIG. 2A, according to various embodiments.
Figure 2C:
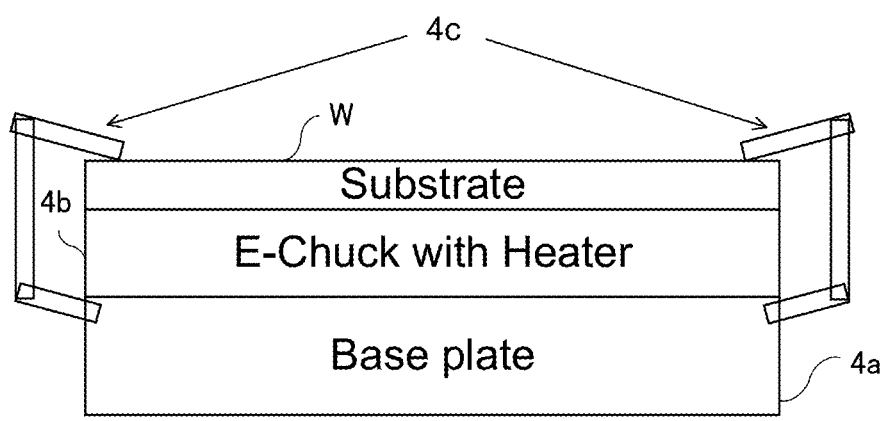
Figure 2D:
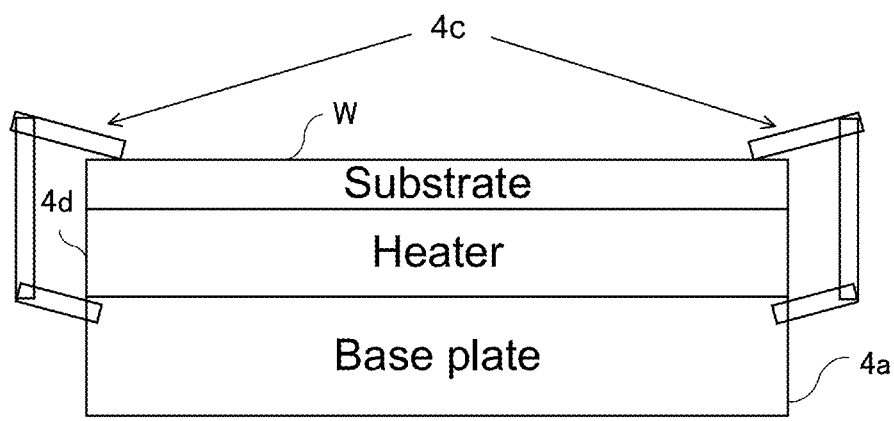

With reference to FIGS. 1 and 2A, a configuration of a heating device according to an exemplary embodiment will now be described. FIGS. 2B-2D illustrate a second support member of the heating device of FIG. 2A, according to various embodiments.

As depicted in FIG. 1, the heating device 20 according to the exemplary embodiment shown in FIGS. 1 and 2A comprises a conveyance mechanism M for conveying a substrate W (e.g., a semiconductor substrate such as a silicon substrate or a silicon carbide substrate, or a glass substrate such as an inorganic alkali glass substrate or a silica glass substrate) between a heating position HP and a non-heating position NH.

The depicted conveyance mechanism M is configured to convey the substrate W by moving the substrate in a swinging movement in a horizontal plane. The conveyance mechanism comprises a conveyance member 10, a first support member 1, and a heat reflecting plate 2. The conveyance member 10 is, for example, a long plate-shaped arm, and is configured such that one end (e.g., a proximal end) thereof is rotated about a pivot shaft 11 by a drive source 12 such as an electric motor. The first support member 1 is provided on the other end (e.g., a distal end) of the conveyance member 10 and supports at least a portion of the outer peripheral edge of the substrate W during conveyance by the conveyance member 10. The heat reflecting plate 2 is attached to the conveyance member 10 in facing relation to the substrate W, and the substrate W is supported by the first support member 1, as shown in, for example, FIG. 2A. Thus, the heat reflecting plate 2 travels with the conveyance member 10.

As shown in FIG. 2A, the heat reflecting plate 2 is configured to cover a surface B of the substrate W. In other words, a facing area of the heat reflecting plate 2 to the surface B of the substrate W is equal to or greater than an area of the surface B, and, when viewing the substrate W across the heat reflecting plate 2, i.e. from top to bottom as shown by the arrow in FIG. 2A, the substrate W is fully hidden behind the heat reflecting plate 2 so that the substrate cannot be visibly observed. That is, the heat reflecting plate 2 is configured to fully cover the surface B of the substrate W.

By using the heat reflecting plate 2 configured as above, heat dissipated from the surface B may be reflected back toward the surface B to obtain a heat reflecting effect over the entire surface B.

As a material for the heat reflecting plate 2, a metal having high heat reflection efficiency, such as aluminum or copper, may be used. On the other hand, additionally considering preventing such a metal material from mixing in the substrate, a non-metal material in combination with a metal material may be used, although in such a materials configuration, reflectance will be deteriorated to a certain degree.

As an example, a portion of the metal material that faces the substrate, the entire surface of the metal material that faces the substrate, or all surfaces of the metal material may be coated with a non-metal material, to prevent the metal material from mixing in the substrate. In this case, the non-metal material is composed of a heat permeable material, and the metal material is composed of a heat reflective material.

Further, with a view to improving reflection efficiency of the heat reflecting plate 2, a thickness, material and the like of the heat reflecting plate 2 may be appropriately selected so as to minimize a heat absorbing capacity thereof.

The heating device 20 comprises a second support member 4 disposed at the heating position HP. In some embodiments, as illustrated in FIG. 2B, the second support member 4 may include a base plate 4a and an electronic chuck (E-Chuck) with a heater 2b. In such a configuration, the E-Chuck may secure the substrate W to the second support member 4. It is noted that the substrate W is illustrated in FIGS. 2B-2D only for purposes of showing how the substrate W is positioned with respect to the second support member 4, and the substrate W is not itself included in the second support member 4. In other embodiments, as illustrated in FIG. 2C, the second support member 4 may include a base plate 4a, the electronic chuck (E-Chuck) with the heater 4b, and a mechanical clamp 4c. In such a configuration, the E-Chuck and/or the mechanical clamp 4c may secure the substrate W to the second support member 4. In yet other embodiments, as illustrated in FIG. 2D, the second support member 4 may include the base plate 4a, a heater 4d, and the mechanical clamp 4c. In such a configuration, an E-Chuck may be omitted and the mechanical clamp 4c may secure the substrate W to the second support member 4. Returning to FIG. 2A, the substrate W is conveyed to the heating position HP by the conveyance member 10, and heated at the heating position HP by the heater 4b or 4d of the second support member 4.

FIG. 2A depicts a state in which the substrate W is heated at the heating position HP. Arrowed lines marked between the second support member 4 and the substrate W schematically denote a flow of heat from the heater 4b or 4d to a surface A of the substrate W. Similarly, arrowed lines marked between the substrate W and the heat reflecting plate 2 schematically denote a flow of heat between the surface B of the substrate W and the heat reflecting plate 2.

In the heating device 20 according to the exemplary embodiment shown in FIGS. 1 and 2A, the heat reflecting plate 2 is provided in facing relation to the surface B of the substrate W, which is a back surface of the substrate W on a side opposite to a surface to be heated by the heater 4b or 4d. As depicted in FIG. 2A, the heat reflecting plate 2 is held between the first support member 1 and the conveyance member 10.

By providing the heat reflecting plate 2, it becomes possible to reflect heat dissipated from the surface B of the substrate W that does not receive heat directly from the heater 4b or 4d back toward the substrate W. This configuration makes it possible to improve a substrate heating efficiency of heating the substrate W, and thus shorten a heating-up period, and reduce an input power to the heater 4b or 4d so as to achieve lower power consumption.

In the heating device 20 according to the exemplary embodiment shown in FIGS. 1 and 2A, the first support member 1 is fixed to the conveyance member 10 by one or more bolts 5. In conjunction with the attachment of the first support member 1 to the conveyance member 10, the heat reflecting plate 2 is attached to the conveyance member 10, so that it is possible to simplify a component assembling operation.

Further, by providing the first support member 1, the heat reflecting plate 2 and the conveyance member 10 as separate components as in the heating device 20 according to the exemplary embodiment shown in FIGS. 1 and 2A, a size, shape and the like of each of the first support member 1 and the heat reflecting plate 2 may be appropriately changed to cope with changes in size of the substrate W to be treated or changes in a temperature distribution property of a surface of a substrate W to be treated. This configuration is superior in terms of versatility as compared to case where a plurality of components are formed as a single-piece integrated body.

Figure 3:
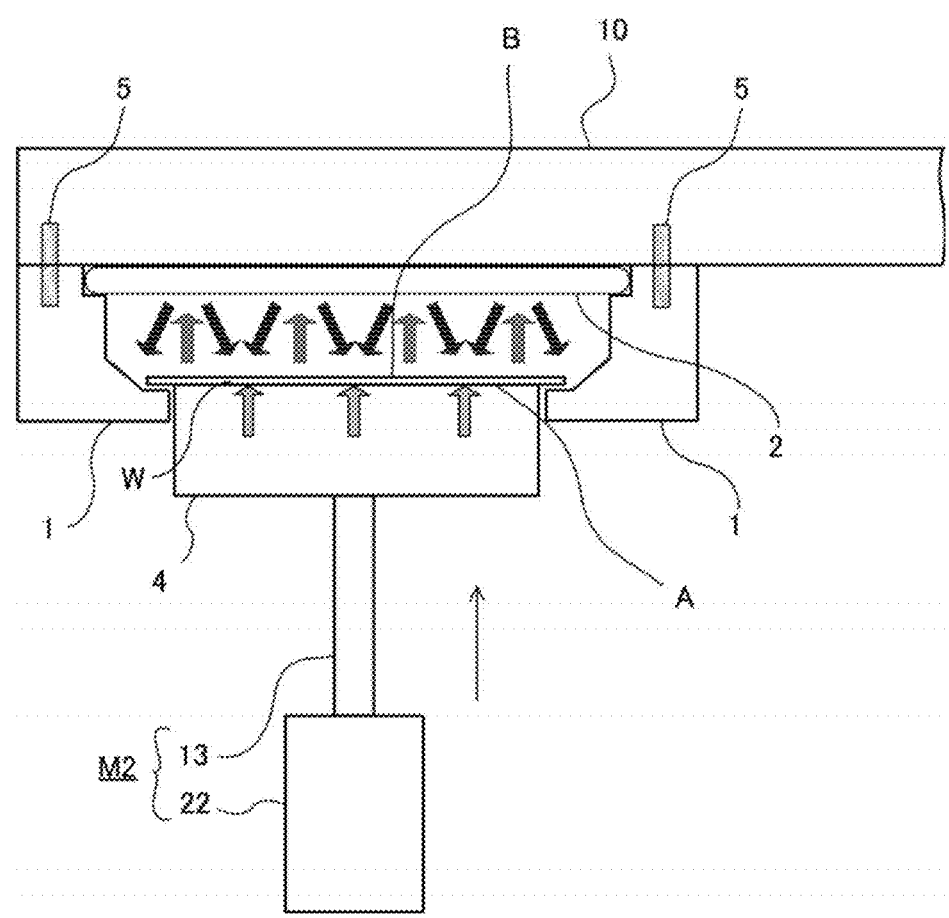
FIG. 3 is a schematic side view depicting a heating device comprising a second conveyance mechanism for conveying a heater, as a modification of the heating device in FIG. 1.

FIG. 3 depicts a heating device according to a modification of the heating device 20 shown in FIGS. 1 and 2A. With a view to further improving the substrate heating efficiency, the heating device according to the modified exemplary embodiment shown in FIG. 3 further comprises a second conveyance mechanism M2 which includes a drive source 22, and a drive shaft 13 coupled to the second support member 4. The second conveyance mechanism M2 is configured to move the second support member 4 in a direction indicated by the arrow in FIG. 3. More specifically, the drive source 22 moves the second support member 4 toward the substrate W.

When the second support member 4 is moved in the direction of the arrow by the second conveyance mechanism M2, a surface of the second support member 4 is brought into contact with the surface A of the substrate W. In a configuration in which the second support member 4 is provided below the substrate W as shown in FIG. 3, when an upper surface of the second support member 4 that is brought in contact with the substrate W is further moved toward the heat reflecting plate 2, the substrate W is transferred from the first support member 1 to the second support member 4.

After the substrate W is transferred to the second support member 4, a distance between heater 4b or 4d of the second support member 4 and the heat reflecting plate 2 is reduced as compared with the heating device 20 shown in FIGS. 1 and 2A, thereby providing further improved substrate heating efficiency.

A timing of heating the substrate W by the heater 4b or 4d may be set just after transferring the substrate W to the second support member 4. That is, the heater 4b or 4d of the second support member 4 may be set to start heating the substrate W after transferring the substrate W to the second support member 4.

Alternatively, the heating of the substrate W may be started before transferring the substrate W to the second support member 4. Specifically, when the second support member 4 is spaced apart from the substrate W before transfer of the substrate W to the second support member 4, the substrate W may be heated by the heater 4b or 4d once. Then, after a substrate temperature of the substrate W is raised to a given value, the substrate W may be transferred to the second support member 4 to further heat the substrate W by the heater 4b or 4d to a target temperature. That is, a two-stage heating method may be employed.

In the two-stage heating method, when the substrate W is supported by the first support member 1, the supporting member 1 has a relatively small supporting area that supports the substrate W. Accordingly, heat stress in the substrate W caused by heat deformation of the substrate W may be released to a certain degree. By comparison, when the substrate W is transferred onto the upper surface of the second support member 4, there is a relatively large supporting area that supports the substrate W (i.e., the upper surface of the second support member 4 supports the substrate W), as compared to a case in which the first support member 1 supports the substrate W. Thus, as compared to case where an entire heat stress is released on the second support member 4 having a relatively large supporting area for the surface A of the substrate W, it becomes possible to reduce a risk of scratching of the surface A of the substrate W due to friction, or breaking of the substrate W.

The configuration of the second conveyance mechanism M2 is not limited to that depicted in FIG. 3. For example, instead of moving the second support member 4, the conveyance member 10 may be moved. Alternatively, both of the second support member 4 and the conveyance member 10 may be moved.

That is, in a generalized concept, the second transfer mechanism M2 may be configured to transfer, at the heating position HP, the substrate W from the first support member 1 to the second support member 4, and further convey the substrate W to a position closer to the heat reflecting plate 2 than a position where the substrate W is supported by the first support member 1.

The configuration of the heat reflecting plate 2 may be variously modified. For example, the heat reflecting plate 2 may be configured as depicted in FIGS. 4A and 4B, and/or FIGS. 5A and 5B, according to various exemplary embodiments.

Figure 4A:
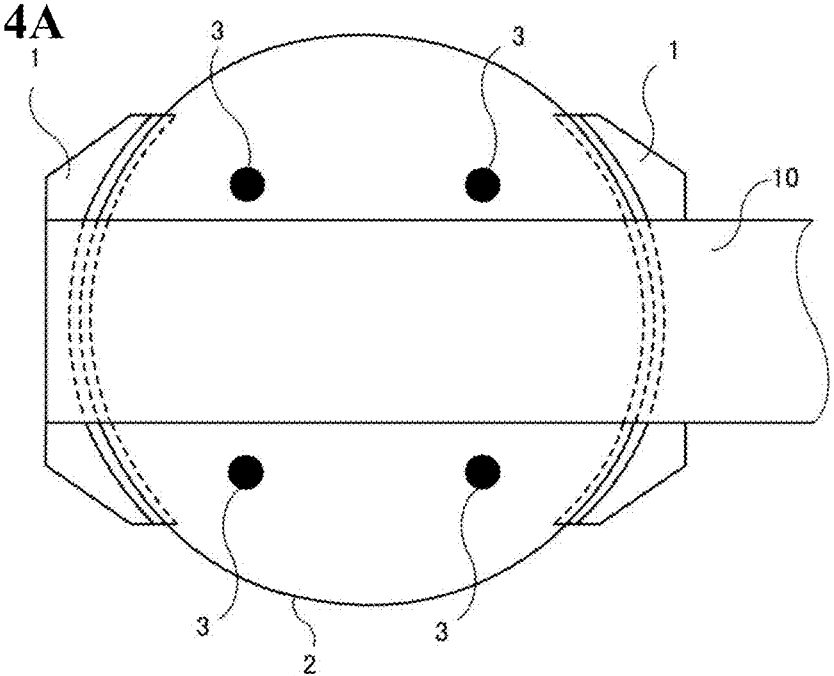
FIGS. 4A and 4B are schematic top plan views depicting modifications of a heat reflecting plate, according to an exemplary embodiment.
Figure 4B:
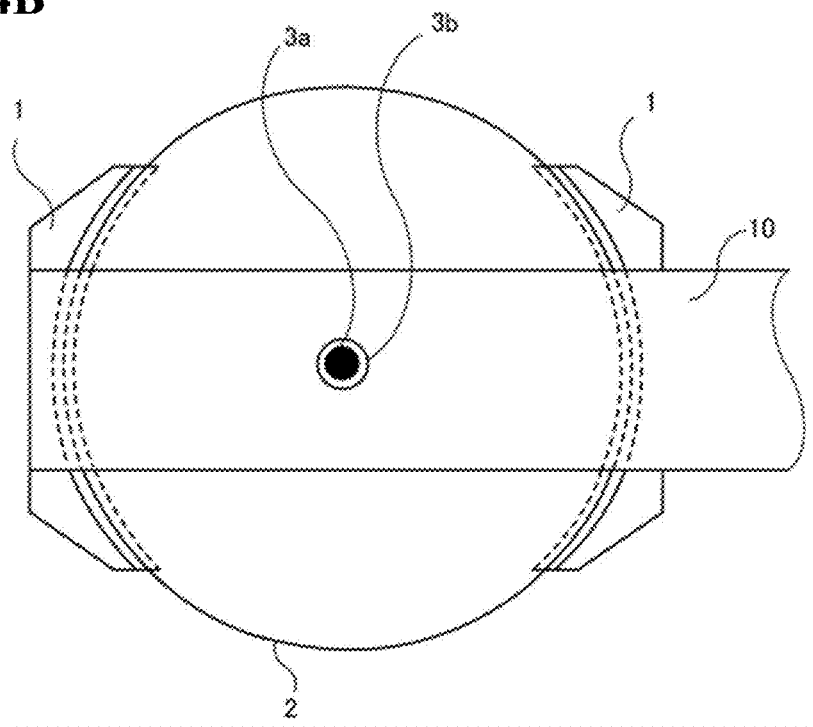

FIGS. 4A and 4B are schematic top plan views depicting modifications of a heat reflecting plate, according to exemplary embodiments. A heat reflecting plate 2 depicted in FIG. 4A is partially formed with at least one opening 3. In the configuration shown in FIG. 4A, four openings 3 are formed in the heat reflecting plate 2a. However, this is only an example, and a number of the openings 3 may be one, or may be two or more. Further, a shape of the opening 3 may be a circular shape as shown in the example of FIG. 4A, or may be any of various other shapes such as a rectangular shape or a triangular shape, and a position of the opening 3 is not limited to the depicted positions in FIG. 4A.

For example, the openings 3 formed as above make it possible to measure the temperature of the substrate W from above the substrate W through the openings 3 by using a radiation thermometer. Further, by appropriately setting a size, shape, position and the like of the openings 3, it becomes possible to adjust a temperature distribution of the surface B of the substrate W on the side of the heat reflecting plate 2.

In a modification shown in FIG. 4B (top plan view), in a case in which a temperature of a central region of the substrate W that overlaps the conveyance member 10 is to be measured from above the substrate W by a radiation thermometer, an opening 3a may be formed in the heat reflecting plate 2 and a corresponding opening 3b may be formed in the conveyance member 10 to expose the central region of the substrate W to be measured. It should be understood that the temperature of the substrate W may be measured using a thermocouple, instead of the radiation thermometer. Further, as a measurement method for the substrate temperature, any of various heretofore-known methods may be employed.

Figure 5A:
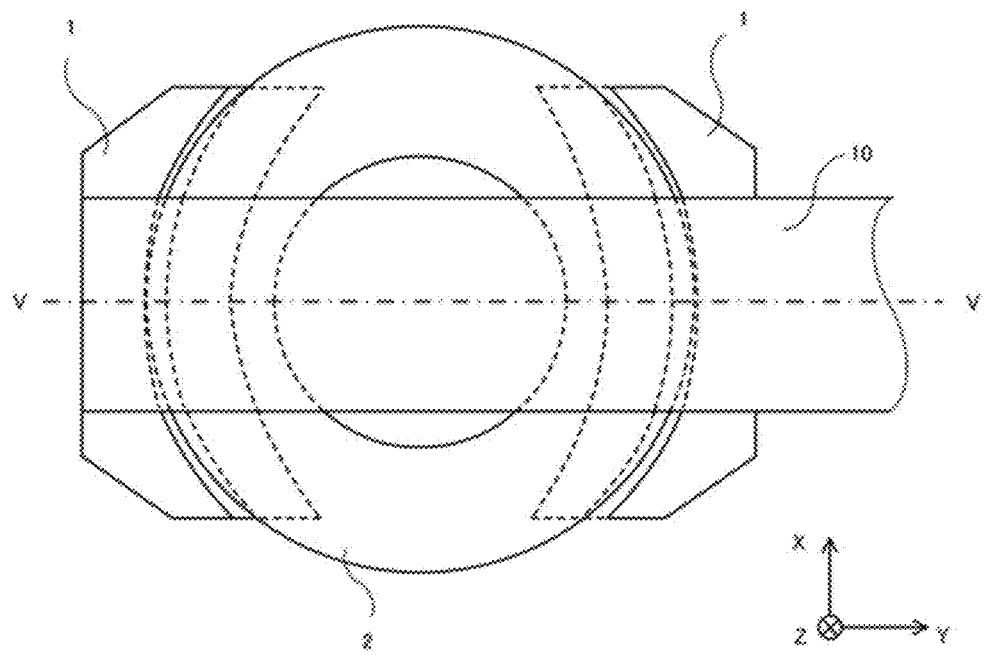
Figure 5B:
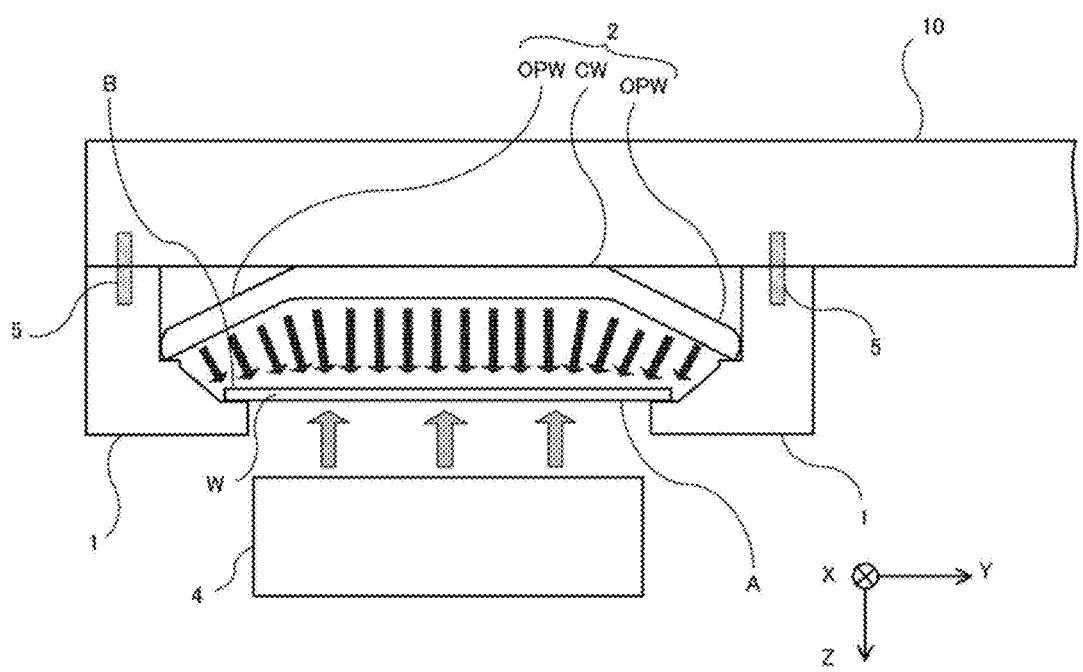

A heat reflecting plate 2 depicted in FIGS. 5A and 5B is formed in a concave shape concaved with respect to the substrate W, instead of a flat plate shape.

FIG. 5A is a top plan view in which the conveyance member 10 located at the heating position HP is viewed from above. FIG. 5B is a sectional view taken in a Z direction along the one-dot chain line V-V in FIG. 5A.

The heat reflecting plate 2 is a member having a flat central wall portion CW along the conveyance member 10, and outer peripheral wall portions OPW that extend from the flat central wall portion CW and gradually incline away from from the conveyance member 10 toward the substrate W. In other words, an acute angle is formed between the conveyance member 10 and the outer peripheral wall portions OPW.

By using the heat reflecting plate 2 configured as above, it becomes possible to effectively reflect heat dissipated from the surface B of the substrate W back toward the substrate W as indicated by the arrowed lines in FIG. 5B.

It should be understood that the concave shape is not limited to the above shape. For example, the outer peripheral wall portion may be gradually expanded in a non-linear manner.

Figure 6:
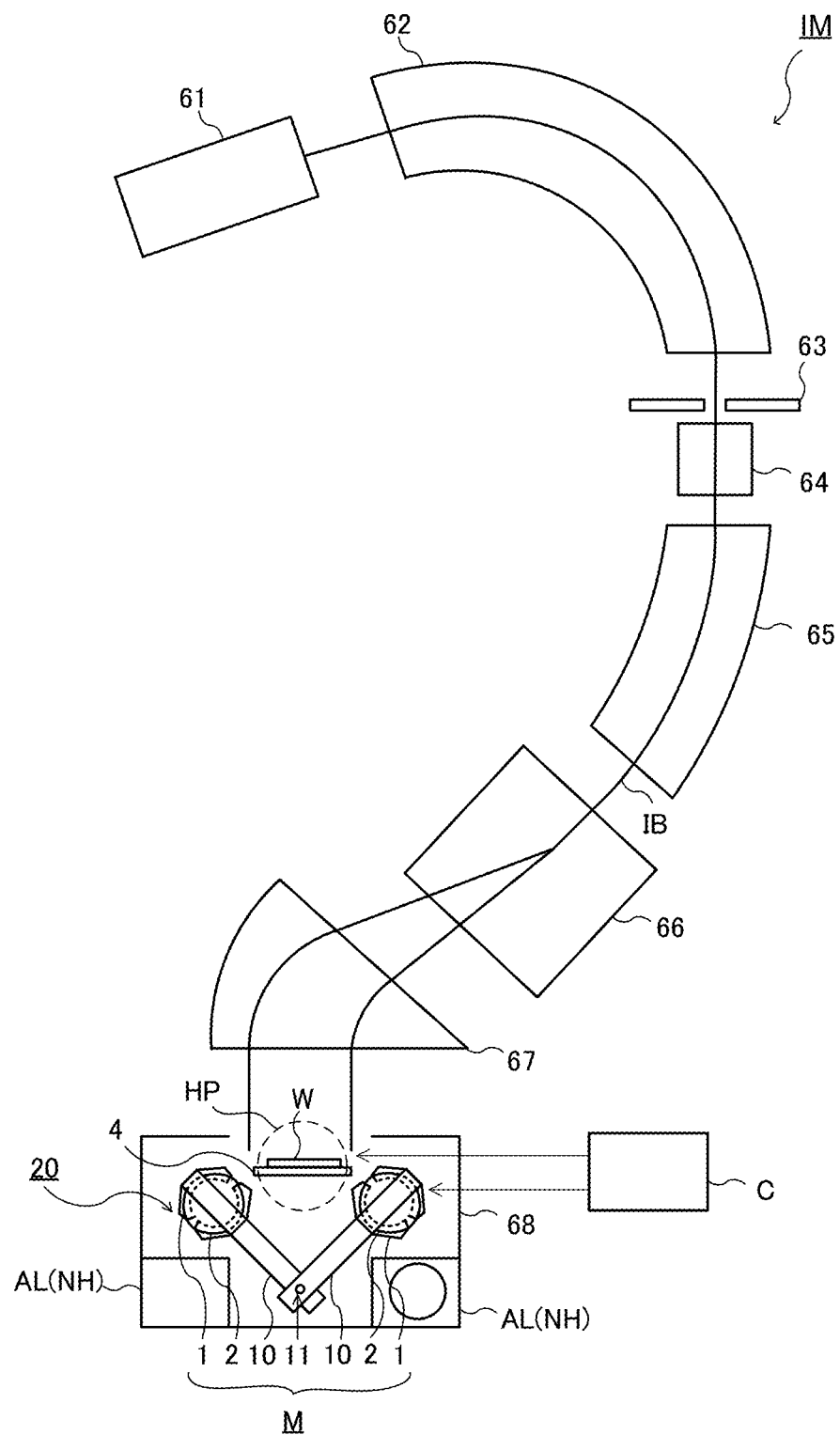
FIG. 6 is a schematic diagram depicting an example of a semiconductor manufacturing apparatus equipped with the heating device, according to an exemplary embodiment.
Figure 7:
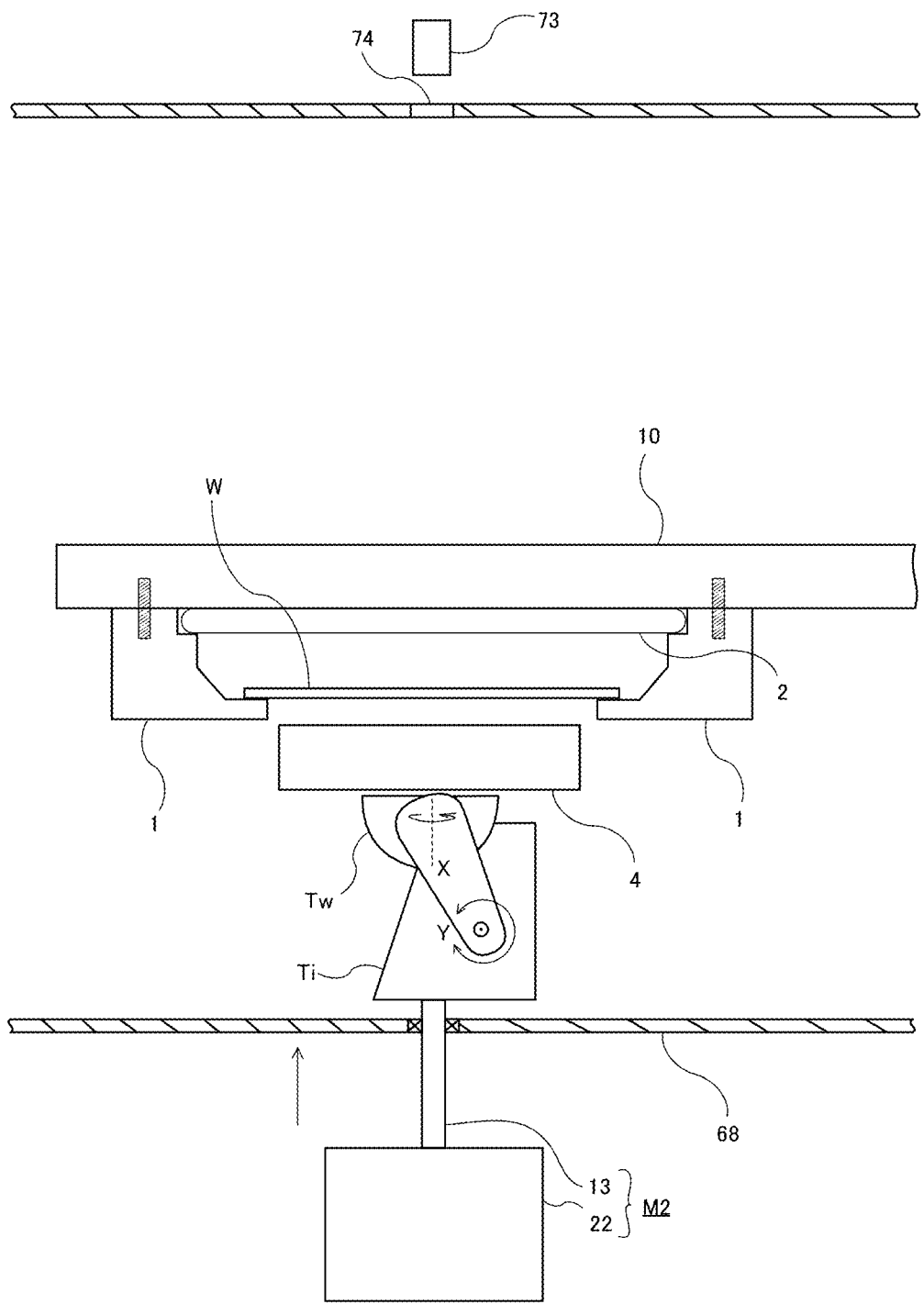
FIG. 7 is a schematic side view depicting a heating device of the semiconductor manufacturing apparatus of FIG. 6, in a state in which a substrate is conveyed to a heating position.

FIGS. 6 and 7 depict an example of a semiconductor manufacturing apparatus equipped with a heating device 20, according to an exemplary embodiment. The semiconductor manufacturing apparatus depicted in FIGS. 6 and 7 may be an ion implantation apparatus IM.

A semiconductor apparatus IM includes an ion source 61, a mass analyzing electromagnet 62, an analysis slit 63, an accelerator/decelerator 64, an energy separator 65, a scanner 66, a beam parallelizer 67, a treatment chamber 68, the heating device 20, and a controller C.

The ion source 61 is operable to emit an ion beam IB. The ion beam IB may be approximately spot-shaped. Then, the mass analyzing electromagnet 62 and the analysis slit 63 are operable to mass analyze the ion beam IB emitted from the ion source 61, and the accelerator/decelerator 64 is operable to accelerate or decelerate the ion beam IB. Subsequently, the energy separator 65 is operable to enable a component of the ion bean IB including a desire energy to pass therethrough to a downstream side, and the scanner 66 is operable to scan the ion beam IB along one direction. The scanned ion beams IB pass through the beam parallelizer 67, so that the scanned ion beams IB are deflected to form ion beams IB parallel to each other in terms of a beam traveling direction, and the parallel ion beams IB enters a treatment chamber 68.

A heating device 20 according to the exemplary embodiment shown in FIGS. 6 and 7 is provided in the treatment chamber 68 and is controlled by the controller C. The controller may be, for example, a microcontroller or a central processing unit (CPU). The controller C may read computer program code coded according to the various functions described below from a memory (not shown) and execute the computer program code in order to control the heating device 20 according to the various functions described below.

As with the exemplary embodiment shown in FIGS. 1 and 2, the heating device 20 shown in FIGS. 6 and 7 may comprise a conveyance mechanism M which comprises two conveyance members 10 each independently turnable about a pivot shaft 11 according to a non-depicted drive source, and a heat reflecting plate 2 attached to a distal end of each of the conveyance members 10. In some embodiments, the conveyance mechanism M may be a same mechanism as the conveyance mechanism M2. In some embodiment, the drive source may be the drive source 22. The conveyance mechanism M is configured to convey a substrate W between a vacuum auxiliary chamber AL which is an example of a non-heating position NH, and an implantation position which is an example of a heating position HP, while supporting the substrate W on a first support member 1 thereof.

The heating device 20 shown in FIGS. 6 and 7 may comprise the second conveyance mechanism M2 described with reference to the exemplary embodiment shown in FIG. 3. As depicted in FIG. 7, the heating device 20 may further comprise a twist mechanism Tw for rotating the second support member 4, about an X axis by an angle, and a tilt mechanism Ti for rotating the second support member 4 and the twist mechanism Tw, about a Y axis by an angle. In some embodiments, the mechanical clamp 4c and/or the E-Chuck may be provided. For example, the E-Chuck may be controlled by the controller C. As another example, the mechanical clamp 4c may be provided an may be actuated by an actuator controlled by the controller C. Further, the heating device 20 may be configured to enable a temperature of the substrate W to be measured from above a ceiling of the treatment chamber 68 through a view port 74 formed in the ceiling, by using a temperature sensor 73 controlled by the controller C. In some embodiments, the temperature sensor 73 may be a radiation thermometer.

As shown in FIGS. 6 and 7, in a state in which the substrate W is supported by the first support member 1, the substrate W is heated by the heater 4b or 4d of the second support member 4 located below the substrate W until the temperature of the substrate W is raised to a first temperature. Then, after transferring the substrate W onto the second support member 4 by the second conveyance mechanism M2, the substrate W is heated while being immovably supported on the second support member 4 by the electrostatic chuck and/or the mechanical clamp, until the temperature of the substrate W is raised to a second temperature (e.g., an eventual target temperature).

Alternatively, in some embodiments, in a state in which the substrate W is supported by the first support member 1, the electrostatic chuck may be turned off (or in the case of a mechanical clamp, the mechanical clamp is unclamped) and the substrate W may be heated by the heater 4b or 4d located below the substrate W until the temperature of the substrate W is raised to a first temperature. Then, the substrate W may be transferred onto the second support member 4 by the second conveyance mechanism M2 operating under the controller C to move the second support member 4 and substrate W upwards. While the electrostatic chuck is still turned off (or the mechanical clamp is unclamped), the substrate W is heated while being supported on the second support member 4, until the temperature of the substrate W is raised to a second temperature (e.g., an eventual target temperature). Once the substrate W reaches the second temperature, the electrostatic chuck is turned on (or the mechanical clamp is clamped) to immovably hold the substrate W on the second support member 4.

After transferring the substrate W to the second support member 4, the conveyance member 10 (without the substrate W) is turned toward the non-heating position NH, i.e., moved away from the position just above the second support member 4. Subsequently, the substrate W which is now on the second support member 4 and free of the conveyance member 10 is rotated about the Y-axis by the tilt mechanism Ti so as to enable the substrate W to be irradiated with the ion beams IB at an angle. The posture of the second support member 4 depicted in FIG. 6 is a state after being rotated 90 degrees from the position in FIG. 7 by the tilt mechanism Ti. In this state, the second support member 4 is reciprocatingly conveyed along a direction of the arrow R described in FIG. 7 by the second conveyance mechanism M2 to thereby perform ion beam irradiation. The various mechanisms described above, including the conveyance mechanism M, the conveyance mechanism M2, the twist mechanism Tw, and/or the tilt mechanism Ti, may be implemented by the controller C and the computer code. Moreover, the temperature sensor 73 that measures the temperature of the substrate W, the electrostatic chuck, and the mechanical clamp and associated actuator may be controlled by the controller C in accordance with associated computer code.

Figure 8:
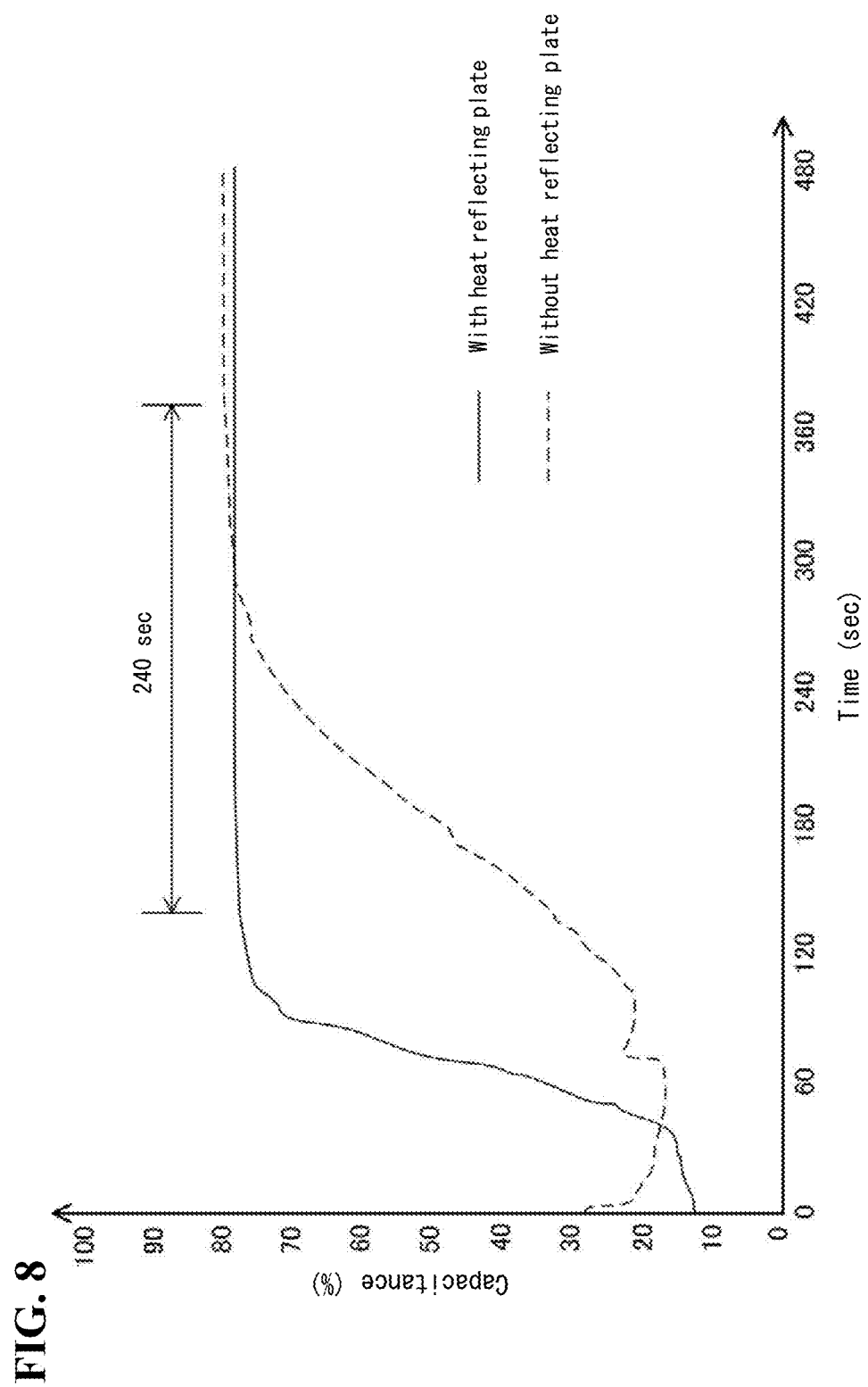
FIG. 8 is a graph depicting experimental results representing a temporal change in capacitance between a substrate and an electrostatic chuck.

FIG. 8 is an experimental result obtained in the ion implantation apparatus IM in FIGS. 6 and 7. This experimental result shows a difference in time for reaching a state in which the substrate W can be immovably supported using the electrostatic chuck in a strong and stable manner, depending on the presence or absence of the heat reflecting plate 2. Except for the presence or absence of the heat reflecting plate 2, the experimental result in FIG. 8 was obtained under the same conditions in terms of the configuration of the ion implantation apparatus IM.

The capacitance on the vertical axis in the graph of FIG. 8 is a capacitance between the substrate W and the electrostatic chuck. The capacitance was measured using a heretofore-known capacitance meter.

A value of capacitance between the substrate W and the electrostatic chuck as measured when a substrate W free of heat strain during a non-heating state in which the substrate W is not heated by the heater 4*b* of the second support member 4 and in a normal-temperature state is chucked onto the second support member 4 by the electrostatic chuck at a chucking voltage of 700 V corresponds to a capacitance of 80% in FIG. 8. When the capacitance is close to 80%, it is determined that heat strain of the substrate W is sufficiently relaxed to establish a state in which the substrate W may be immovably supported on the second support member 4 in a strong and stable manner, and it is allowed to advance to the next step (of immovably supporting the substrate W by the electrostatic chuck).

Time 0 (sec) on the horizontal axis in the graph of FIG. 8 denotes a time after the substrate W supported on the first support member 1 has been heated for 30 sec by the heater 4*b* of the second support member 4 and then transferred onto the second support member 4 by the second conveyance mechanism M2.

In FIG. 8, comparing the heating device with the heat reflecting plate 2, according to the above exemplary embodiments, to a heating device without the heat reflecting plate 2, it is shown that, in the heating device according to the above exemplary embodiments, the capacitance reaches 80% at an earlier timing by about 240 sec. This shows that the heating device with the heat reflecting plate 2, according to the above exemplary embodiments, makes it possible to significantly shorten a time for fulfilling a condition for immovable support of the substrate W in a strong and stable manner.

In the heating device according to the above exemplary embodiments, the conveyance member 10 is configured to be turned so as to convey the substrate W. Alternatively, the conveyance member 10 may be configured to be moved linearly so as to convey the substrate W. For example, a conveyance member 10 may be configured such that a central portion thereof is provided with a first support member 1 for supporting the substrate W, and opposite ends thereof are slidably moved by a linearly moving mechanism.

A usage environment of the heating device 20 according to the above exemplary embodiments may be a vacuum environment or may be an atmospheric environment. The heating device 20 according to the above exemplary embodiments may be used in any of various semiconductor manufacturing apparatuses other than the ion implantation apparatus depicted in FIGS. 6 and 7, such as a film forming apparatus, requiring preliminary heating of a substrate. The heating device 20 according to the above exemplary embodiments may be used in any semiconductor manufacturing apparatus which preforms heating of a substrate.

Although the above exemplary embodiments have been described based on an example where the electrostatic chuck is employed as a mechanism for immovably supporting the substrate W on the second support member 4, it is possible to use any heretofore-known mechanical-type or vacuum suction-type immovably supporting mechanism, instead of the electrostatic chuck. The immovably supporting mechanism may be composed of a combination of mechanical-type and either vacuum suction-type or electrostatic-type immovable support mechanisms. Examples are illustrated in FIGS. 2B-2D.

Although the above exemplary embodiments have been described based on an example where the conveyance member 10 has a long plate shape, the shape of the conveyance member 10 is not limited thereto, but may be any of various shapes, such as a circular shape and a triangular shape.

Although the above exemplary embodiments have been described based on an example where the heat reflecting plate is configured to fully cover the non-heated surface of the substrate W, the size of the heat reflecting plate is not limited thereto.

Figure 9A:
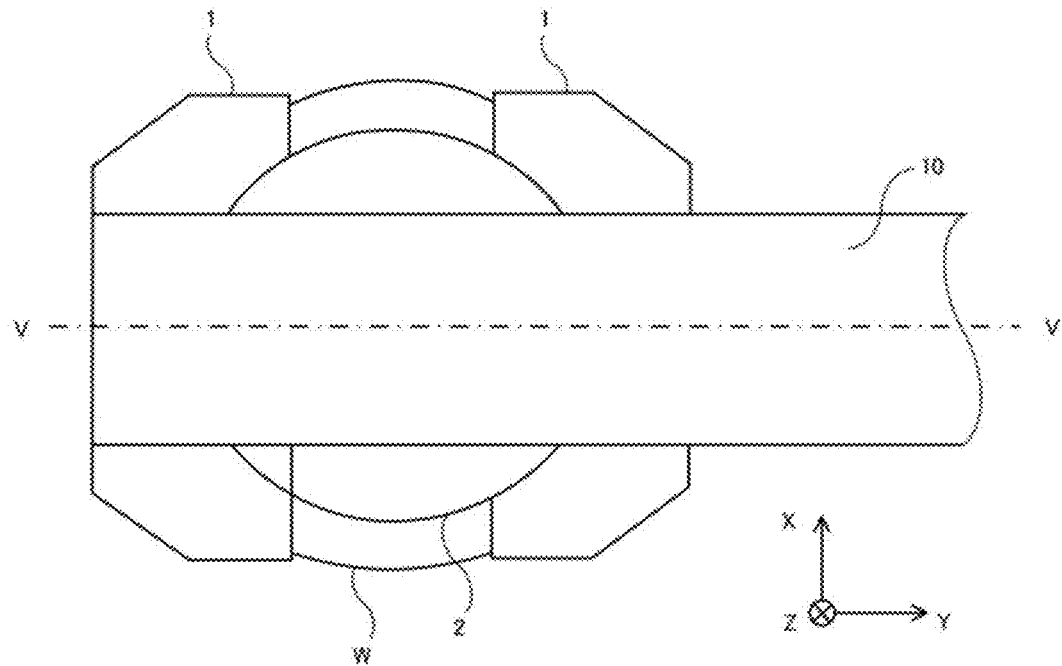
Figure 9B:
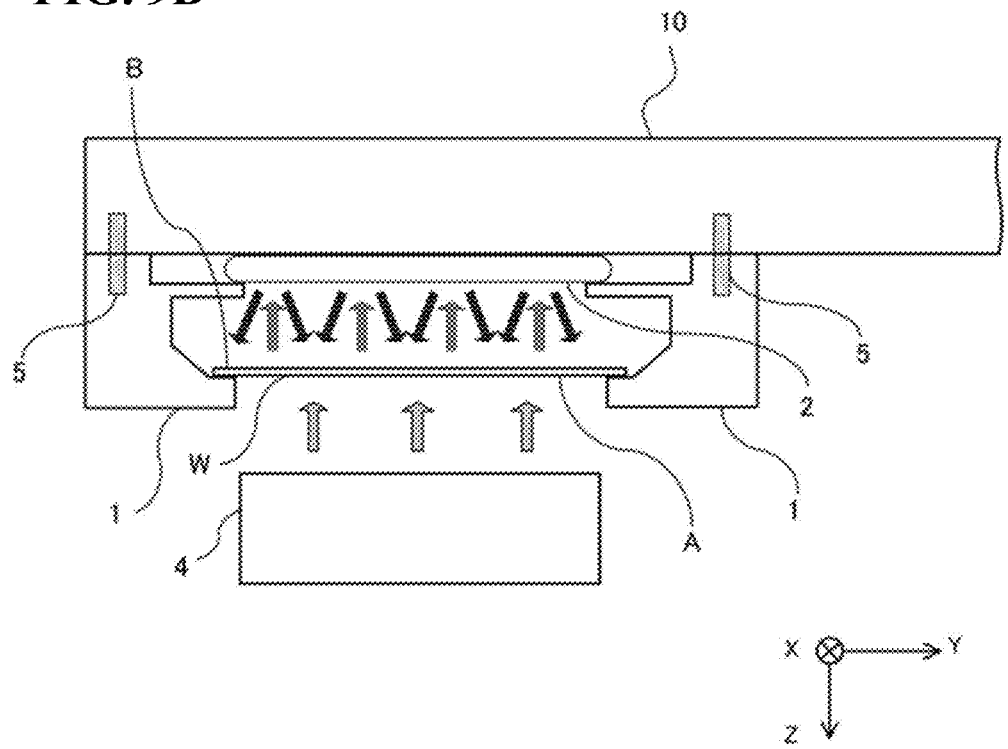

For example, as depicted on FIGS. 9A and 9B, a heat reflecting plate having a size less than a size of the substrate W may be provided on the side of the surface B of the substrate W from which heat is dissipated. In this case, it is also possible to reflect heat dissipated from the surface B of the substrate W back toward the substrate W.

Although the above exemplary embodiments have been described based on an example where the heater 4*b* or 4*d* of the second support member 4 is disposed on the side of one surface of the substrate W so as to heat the substrate W, an additional heater may be disposed between the heat reflecting plate 2 and the substrate W.

Figure 10:
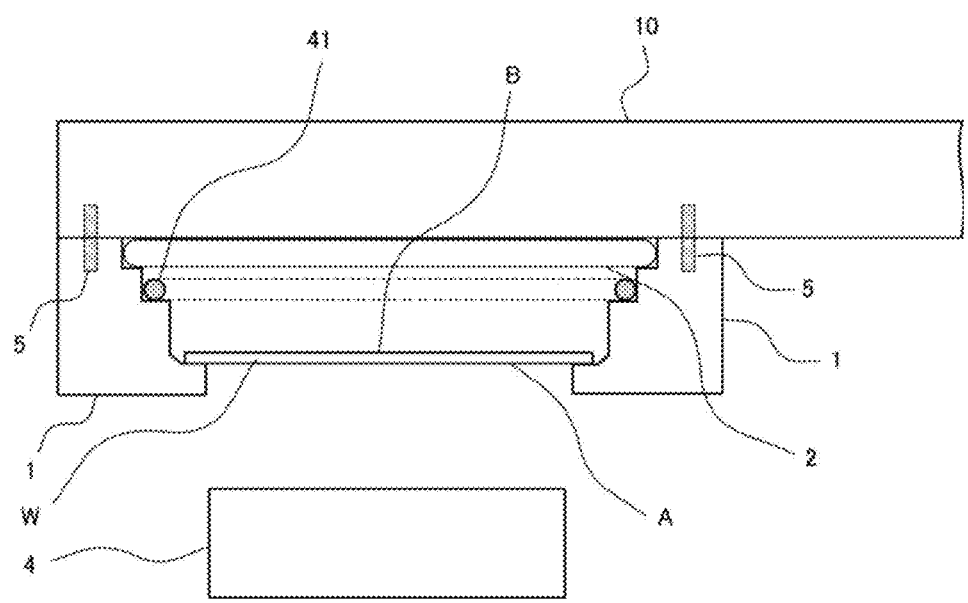
FIG. 10 is an explanatory diagram depicting an additional heater, according to an exemplary embodiment.

For example, an additional heater 41 may be an annular-shaped carbon infrared heater having an open space in a central region thereof so as to enable the heat reflecting plate 2 to be seen therethrough from the side of the substrate W, and supported on the first support member 1 as depicted in FIG. 10. During a period in which the substrate W is conveyed from the non-heating position NH to the heating position HP by the conveyance member 10, the substrate W may be heated by the additional heater 41 beforehand. This makes it possible to complete the substrate heating in a shorter period of time.

Figure 11A:
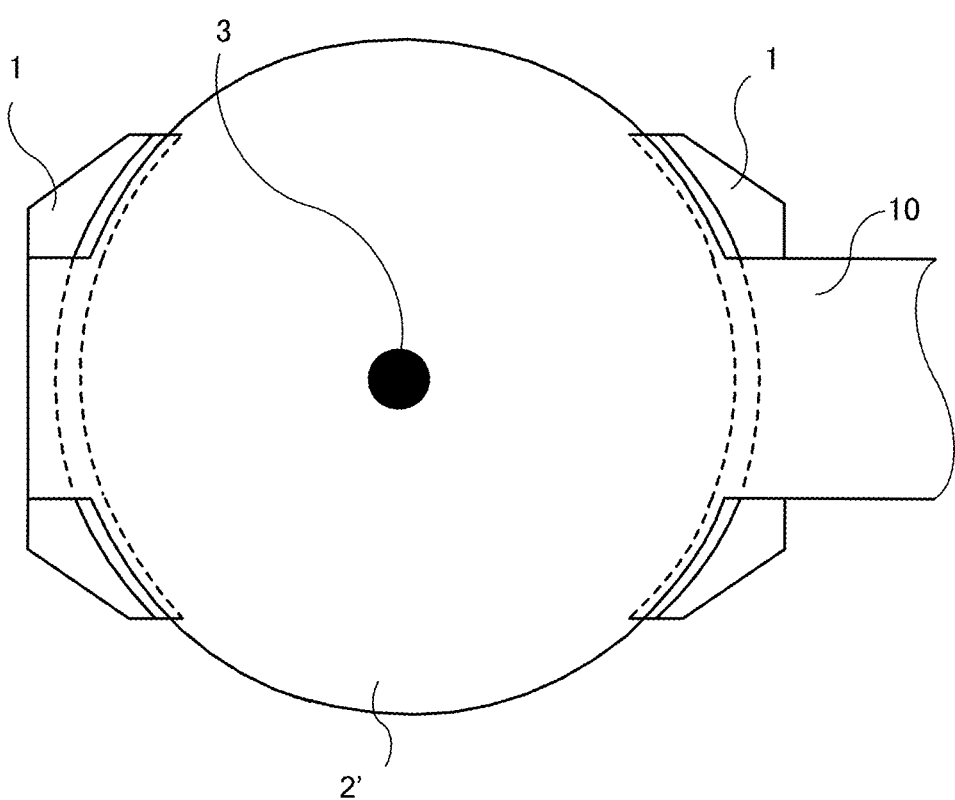
FIGS. 11A-11B are a schematic top plan view and a sectional view, respectively, depicting a heat reflecting plate, according to another embodiment.
Figure 11B:
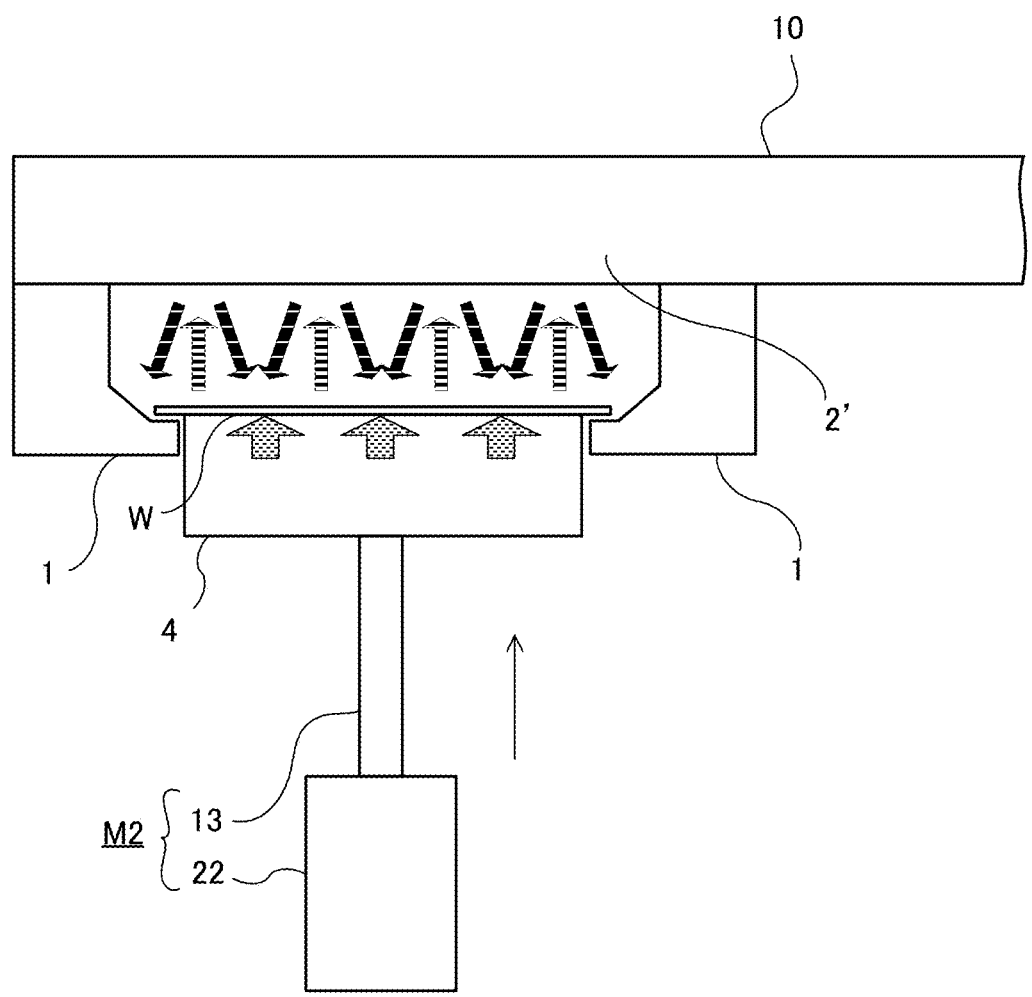

FIGS. 11A-11B are a schematic top plan view and a sectional view, respectively, depicting a heat reflecting plate, according to another embodiment. In FIGS. 11A-11B, like reference numbers are used for like components in FIGS. 1-10, and repeated description thereof is omitted for conciseness.

A heat reflecting plate 2' of FIGS. 11A-11B travels with the conveyance member 10 and is similar to the heat reflecting plate 2 of FIGS. 1-3, 4B, 6, and 7, except that the heat reflecting plate 2' is integrally formed in the conveyance member 10. In other words, the heat reflecting plate 2' may be formed in the conveyance member 10. For example, the heat reflecting plate 2' may be an integrated plate integrated into the conveyance member 10. As another example, the heat reflecting plate 2' may be formed from at least a portion of the conveyance member 10. For example, the heat reflecting plate 2' may be made of carbon, molybdenum and/or tungsten, or other heat resistant material. Thus, unlike the heat reflecting plate 2 of FIG. 4B, there is no need to assemble a reflecting plate onto the conveyance member 10.

Figure 12A:
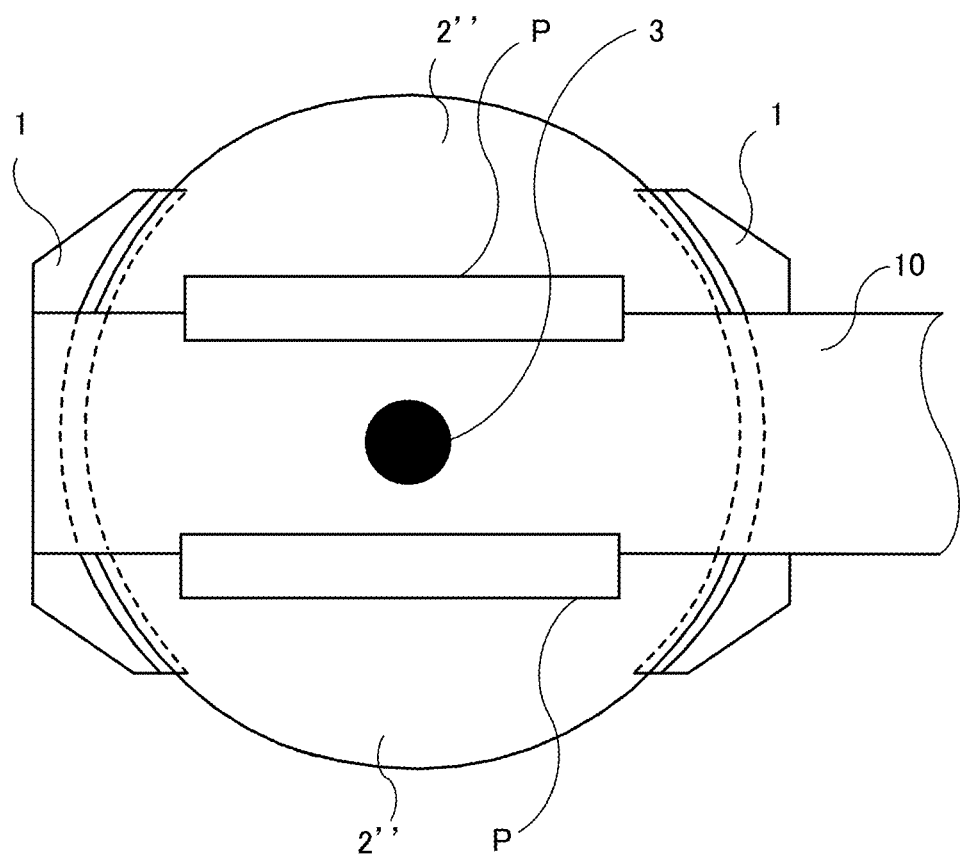
FIGS. 12A-12C are a schematic top plan view, an exploded view, and a sectional view, respectively, depicting a heat reflecting plate, according to another embodiment.
Figure 12B:
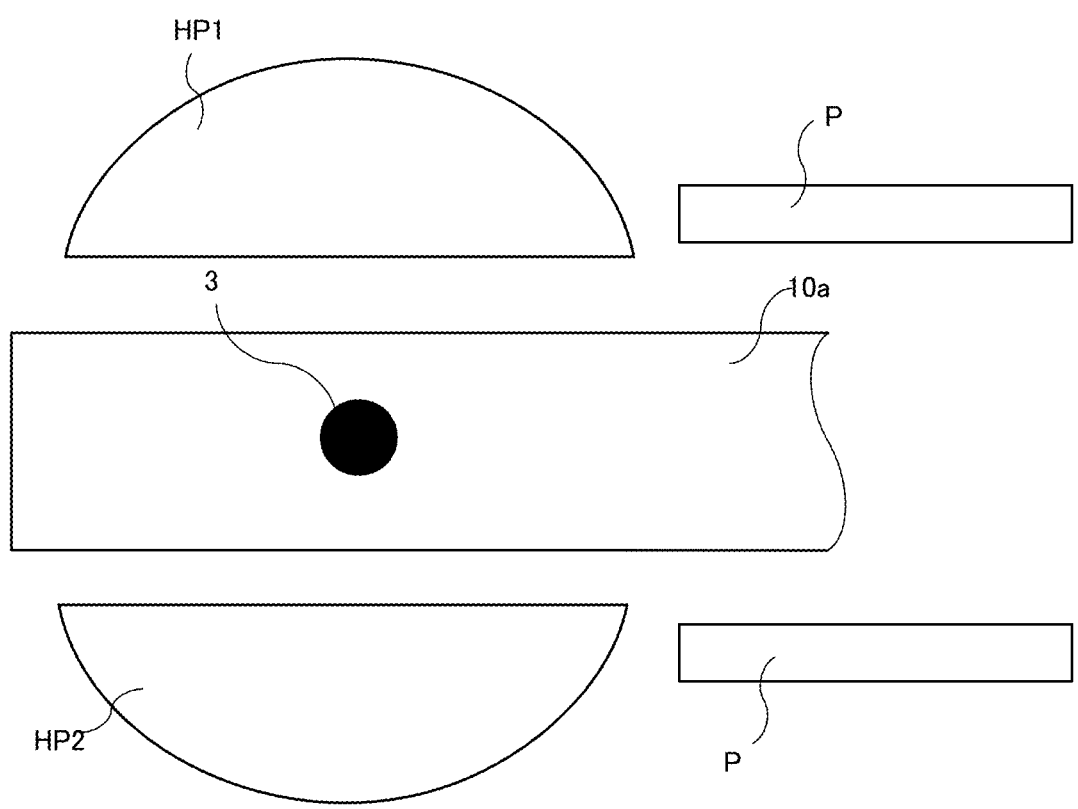

FIGS. 12A-12B are a schematic top plan view and an exploded view, respectively, depicting a heat reflecting plate, according to another embodiment.

Figure 12C:
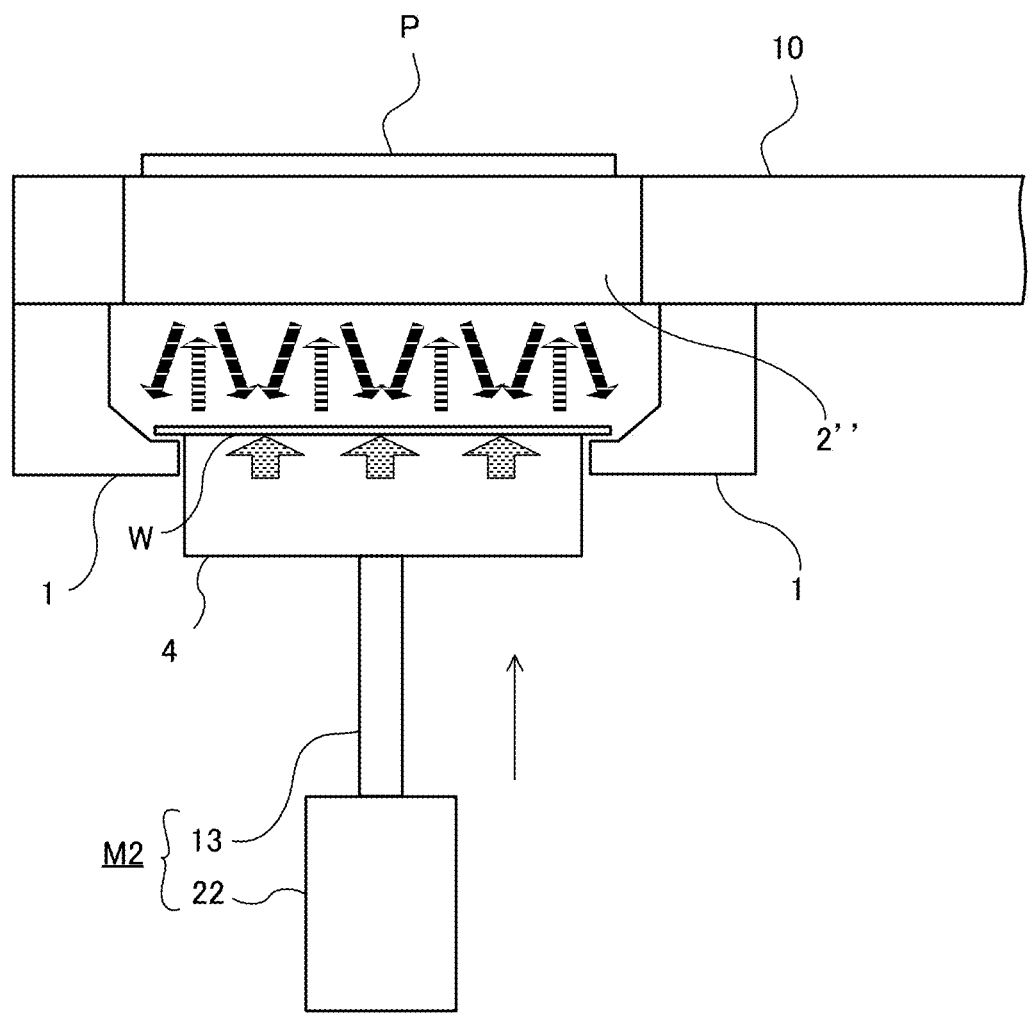

As illustrated in FIGS. 12A-12B, a heat reflecting plate 2" travels with the conveyance member 10 and is similar to the heat reflecting plate 2' of FIG. 11, except that the heat reflecting plate 2" is provided in two halves. In FIGS. 12A-12C, like reference numbers are used for like components in FIGS. 11A-11B, and repeated description thereof is omitted for conciseness. The heat reflecting plate 2" may be formed of two half plates HP1 and HP2 and a part 10a of conveyance member 10. The two half plates HP1 and HP2 may each have a crescent moon shape. Connecting members P may provide a bridge between one of the two half plates HP1 and HP2 and the part 10a of the conveyance member 10. That is, one connecting member P may provide a connection between the half plate HP1 and the part 10a, and another connecting member P may provide a connection between the half plate HP2 and the part 10a. One or more bolts (not shown) may be used to fasten each of the connecting member P to a respective one of the two half plates HP1 and HP2 and to the part 10a of the conveyance member 10.

According to the exemplary embodiments illustrated in FIGS. 11A-11B, it is not necessary to provide a separate heat reflecting plate to be attached to the conveyance member because the heat reflecting plate is integrated into conveyance member 10.

According to the exemplary embodiments illustrated in FIGS. 11A-11B and 12A-12C, it is not necessary to prepare a special heater separated from the substrate support, and thus space may be saved and the apparatus size may be made smaller.

According to the exemplary embodiments illustrated in FIGS. 11A-11B and 12A-12C, a substrate may be heated by placing the substrate on the second support member 4 without any chucking force by an electrostatic chuck and/or clamping by a mechanical clamp. Therefore, the substrate may be rapidly heated to a predetermined high temperature, because a position of substrate may be very close to a heater of the second support member 4.

According to the various exemplary embodiments described above, monitoring of a temperature of the substrate may be performed by a temperature sensor 73 under control of the controller C. Additionally, when the conveyance member 10 is not located above the second support member 4, the temperature of the second support member 4 also may be measured by the temperature sensor 73. In some embodiments, the temperature sensor 73 may be a radiation thermometer, similar to the embodiment illustrated in FIG. 7, or a thermographic camera. In the case of the thermographic camera, the thermographic camera may be provided at a ceiling of a vacuum chamber. In case of the thermographic camera, an average temperature value of the substrate may be used as the substrate temperature. Similarly, an average temperature value of the second support member 4 may be used as the support member temperature. Also, in some embodiments, a thermocouple may be used. For example, the thermocouple may extend from the heater 4b or 4d of the second support member 4 to the substrate W or the upper surface of the second support member 4 and may be used in monitoring the temperature of the substrate W or second support member 4.

The temperature of the substrate W may be measured either directly or indirectly to ensure that the temperature of the substrate is sufficient for the processing to be performed on the substrate W. In some embodiments, the temperature of the substrate may be set to predetermined temperature value, and the temperature of the substrate may be measured directly or indirectly to determine whether the temperature of the substrate is the predetermined temperature value. If the temperature of the substrate is not the predetermined temperature value, an adjustment such as changing the temperature of the heater 4b or 4d, may be performed to change the temperature of the substrate. Similarly, the temperature of the second support member 4 may be measured either directly or indirectly. Since the second support member 4 includes the heater 4b or 4d, the temperature of the heater 4b or 4d may be adjusted such that the temperature of the second support member 4 is a predetermined temperature value. The predetermined temperature value of the second support member 4 may be different from the predetermined temperature value of the substrate.

In some embodiments, real time monitoring of the temperature of the substrate W or second support member 4 may be performed. In some embodiments, real time monitoring of the temperature of the substrate may be performed by monitoring, for example, a temperature of a dielectric layer of the second support member 4 where a substrate W is positioned. The temperature of the dielectric layer may be monitored by a thermocouple inserted into the second support member 4, as discussed above. Additionally, in some embodiments, real time monitoring of the temperature of the second support member 4 may also be performed. In some cases, a temperature on a surface of the second support member 4 may be slightly different from a temperature from an inner portion of the second support member 4 where the heater 4b or 4d is located. Thus, real time monitoring of the temperature of the second support member 4 allows for adjusting the temperature of the heater 4b or 4d in order to ensure the temperature on the surface of the second support member 4 maintains a temperature sufficient to heat the substrate W to the temperature for processing the substrate.

Figure 13:
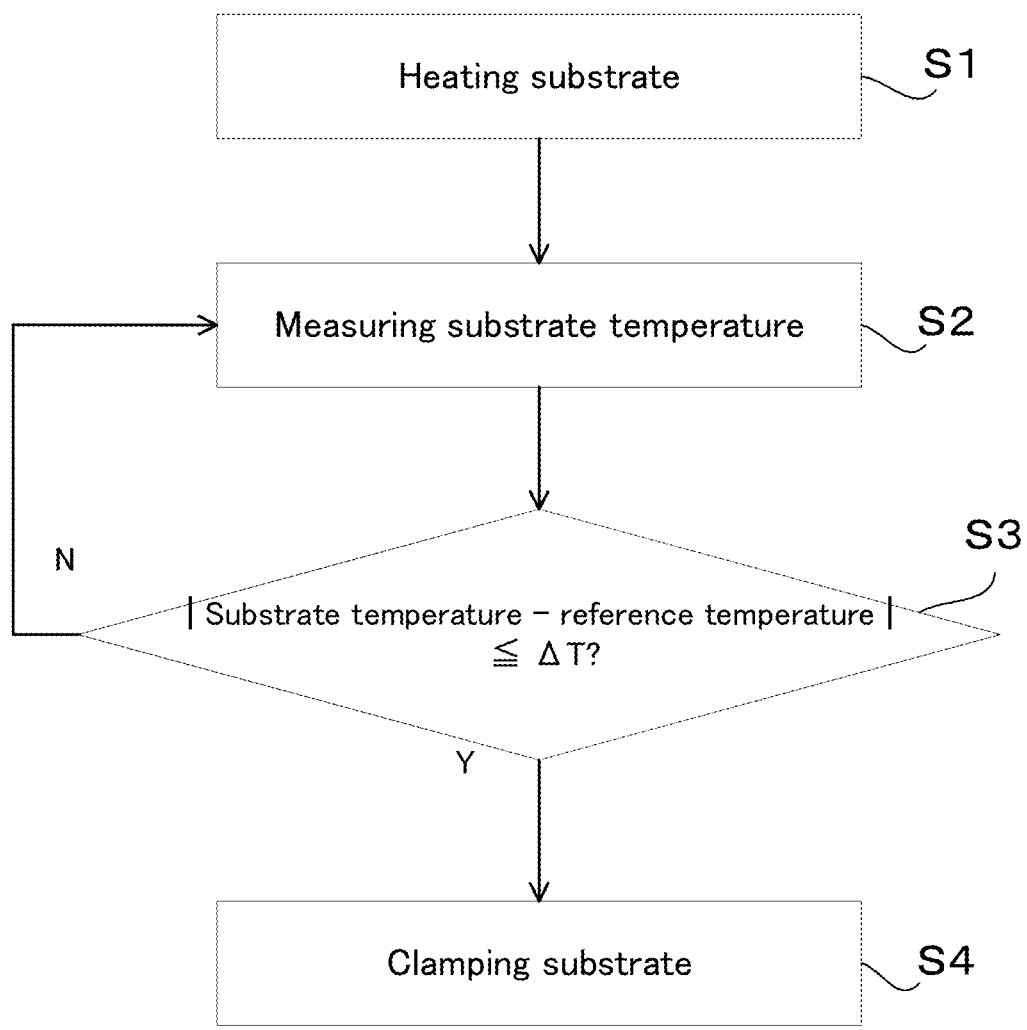
FIG. 13 illustrates an example of a method of operating a heating device according to an embodiment.

FIG. 13 illustrates an example of a method of operating a heating device according to an embodiment. The operations of the method may be performed by the controller C.

As illustrated in FIG. 13, in operation S1, a substrate may be heated. For example, at the heating position, the heater 4b or 4d of the second support member 4 may be turned on to heat the substrate W, under control of the controller C. In some embodiments, the electronic chuck (E-Chuck) may be turned off during heating and/or the substrate W may be unclamped during heating. In operation S2, a temperature of the substrate W may be measured. For example, the temperature may be measured by the temperature sensor 73 as described above, under control of the controller C. In some embodiments, a temperature of the second support member 4 may also be measured. In operation S3, the controller C may calculate an absolute value of a temperature difference between the substrate temperature and a reference value, and determine whether the absolute value is less than or equal to a threshold temperature. In some embodiments, the reference value may be predetermined, and may be set experimentally or by a user. In other embodiments, the reference value may be the measured temperature of the second support member 4. The threshold temperature may be predetermined and may be set experimentally or by a user. If the absolute value of the temperature difference is less than the threshold temperature (S3, YES), the substrate may be clamped by the electrostatic chuck or the mechanical clamp in operation S4. If the absolute value of the temperature difference is greater than the threshold temperature (S3, NO), the method may return to operation S2 to measure the substrate temperature.

It is understood that the present inventive concept is not limited to the above exemplary embodiments, but various other changes and modifications may be made therein without departing from the spirit and scope thereof as set forth in appended claims.

What is claimed is:

1. A heating device comprising:
    a conveyance member;
    a first support member that is provided on the conveyance member and that supports a substrate during movement of the conveyance member;
    a second support member that includes a heater and that supports the substrate during processing of the substrate; and
    a heat reflecting plate that travels with the conveyance member and that reflects heat from the heater toward the substrate,
    wherein the heat reflecting plate comprises two half plates and two connecting portions, each connecting portion connecting a respective one of the two half plates to the portion of the arm.

2. The heating device as recited in claim 1, wherein the heat reflecting plate is attached to the conveyance member.

3. The heating device as recited in claim 1, wherein the heat reflecting plate is integrally formed from a portion of the conveyance member.

4. The heating device as recited in claim 1, wherein the second support member comprises an electrostatic chuck that is operable when engaged to hold the substrate to the second support member.

5. The heating device as recited in claim 1, wherein the second support member comprises an electrostatic chuck or a mechanical clamp which, when engaged, holds the substrate to the second support member.

6. The heating device as recited in claim 5, further comprising:
    a temperature sensor; and
    a controller configured to:
        control the temperature sensor to measure a temperature of the substrate;
        determine a temperature difference between the measured temperature and a reference temperature; and
        control the electrostatic chuck or mechanical clamp based on the determined temperature difference.

7. The heating device as recited in claim 6, wherein the controller is configured to, based on the determined temperature difference being less than or equal to a threshold temperature, control the electrostatic chuck or mechanical clamp to engage to hold the substrate to the second support member.

8. The heating device as recited in claim 7, wherein the controller is further configured to measure a temperature of the second support member, and
    wherein the reference temperature comprises the measured temperature of the second support member.

9. The heating device as recited in claim 6, wherein the controller is further configured to measure a temperature of the second support member, and
    wherein the reference temperature comprises the measured temperature of the second support member.

10. The heating device as recited in claim 1, further comprising a controller configured to turn on the heater to heat the substrate.

11. The heating device as recited in claim 1, wherein the heat reflecting plate is configured to cover the substrate.

12. The heating device as recited in claim 1, further comprising a controller configured to transfer the substrate from the first support member to the second support member, and convey the transferred substrate to a position closer to the heat reflecting plate than a position at which the first support member supports the substrate.

13. The heating device as recited in claim 12, wherein the second support member immovably supports the substrate after the transfer by one or more of a mechanical manner, an electrostatic manner or a vacuum suction manner.

14. The heating device as recited in claim 1, wherein the heat reflecting plate is formed with an opening.

15. The heating device as recited in claim 1, wherein the heat reflecting plate has a concave shape.

16. A heating device comprising:
    an arm having a substrate support that supports a substrate attached thereto;
    a heater operable to heat a surface of the substrate; and
    a heat reflecting plate formed of a portion of the arm that is opposite to the substrate,
    wherein the heat reflecting plate comprises two half plates and two connecting portions, each connecting portion connecting a respective one of the two half plates to the portion of the arm.

17. The heating device as recited in claim 16, wherein the heater heats a first surface of the substrate, and the heat reflecting plate reflects heat toward a second surface of the substrate that is opposite to the first surface.

18. The heating device as recited in claim 16, wherein the heat reflecting plate comprises at least one opening.

19. The heating device as recited in claim 16, wherein the heat reflecting plate is concave.

20. A heating device comprising:
    an arm having a substrate support that supports a substrate attached thereto;
    a heater operable to heat a surface of the substrate; and
    a heat reflecting plate formed of a portion of the arm that is opposite to the substrate,
    wherein the heat reflecting plate comprises multiple plates and multiple connecting portions, each connecting portion connecting a respective one of the plates to the portion of the arm.

* * * * *